US010678293B2

(12) United States Patent
Pascall et al.

(10) Patent No.: US 10,678,293 B2
(45) Date of Patent: Jun. 9, 2020

(54) SYSTEMS FOR MECHANICAL LOGIC BASED ON ADDITIVELY MANUFACTURABLE MICRO-MECHANICAL LOGIC GATES

(71) Applicants: Andrew Pascall, Livermore, CA (US); Julie Mancini, Livermore, CA (US); Robert Matthew Panas, Dublin, CA (US); Yuanping Song, Los Angeles, CA (US); Jonathan Hopkins, Los Angeles, CA (US)

(72) Inventors: Andrew Pascall, Livermore, CA (US); Julie Mancini, Livermore, CA (US); Robert Matthew Panas, Dublin, CA (US); Yuanping Song, Los Angeles, CA (US); Jonathan Hopkins, Los Angeles, CA (US)

(73) Assignees: Lawrence Livermore National Security, LLC, Livermore, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 16/178,690

(22) Filed: Nov. 2, 2018

(65) Prior Publication Data

US 2020/0142440 A1  May 7, 2020

(51) Int. Cl.
*G06C 21/04* (2006.01)
*H03K 19/20* (2006.01)
*H03K 19/02* (2006.01)

(52) U.S. Cl.
CPC ............ *G06C 21/04* (2013.01); *H03K 19/02* (2013.01); *H03K 19/20* (2013.01)

(58) Field of Classification Search
None
See application file for complete search history.

(56) References Cited

U.S. PATENT DOCUMENTS

| 6,441,405 B1 * | 8/2002 | Smith ................... G11C 23/00 257/103 |
| 10,122,365 B2 | 11/2018 | Pascall et al. |

(Continued)

OTHER PUBLICATIONS

Sauder, J. "Automaton Rover for Extreme Environments," NASA, 2017, 44 pp.

(Continued)

*Primary Examiner* — Jany Richardson
(74) *Attorney, Agent, or Firm* — Harness, Dickey & Pierce, PLC (57) ABSTRACT

The present disclosure is directed to various mechanical logic gates. In one example a mechanical logic NOT gate system is formed which has a first pair of bi-stable buckling structures each being operatively connected at a first connection point thereof to one another, and also to a first rigid structure at second connection points, the first rigid structure being held stationary. A second pair of bi-stable buckling flexures is each operatively connected at first connection points thereof to each other and at second connection points thereof to a second rigid structure being held stationary. An output element is coupled a first one of each of the first and second pairs of bi-stable buckling structures. An input element is coupled to a second one of each of the first and second pairs of bi-stable buckling structures. The output element moves from a logic 1 position to a logic 0 position in response to movement of the input element from a logic 0 position to a logic 1 positions, respectively.

19 Claims, 9 Drawing Sheets

(56) References Cited

U.S. PATENT DOCUMENTS

2007/0188846 A1* 8/2007 Slicker ............... H01H 1/0036
　　　　　　　　　　　　　　　　　　　　　　　359/290
2017/0192748 A1* 7/2017 Merkle ................ H01B 3/307
2018/0316353 A1* 11/2018 Hafiz .................. H03K 19/02

OTHER PUBLICATIONS

Merkle, R.C., Freitas, R.A., Hogg, T., Moore, T.E., Moses, M.S. and Ryley, J., 2018. "Mechanical computing systems using only links and rotary joints," Journal of Mechanisms and Robotics, 10(6), p. 061006.

Ion, A., Wall, L., Kovacs, R. and Baudisch, P., "Digital mechanical metamaterials," In Proceedings of the 2017 CHI Conference on Human Factors in Computing Systems, 2017, pp. 977-988.

Raney, J.R., Nadkarni, N., Daraio, C., Kochmann, D.M., Lewis, J.A. and Bertoldi, K. "Stable propagation of mechanical signals in soft media using stored elastic energy," Proceedings of the National Academy of Sciences, 113(35), 2016, pp. 9722-9727.

\* cited by examiner

Design A | Design B

Undeformed Shape:

1st Buckling Mode Shape and Critical Threshold:

2nd Buckling Mode Shape and Critical Threshold:
(Only One of the Mode Shapes is Displayed)

SYSTEMS FOR MECHANICAL LOGIC BASED ON ADDITIVELY MANUFACTURABLE MICRO-MECHANICAL LOGIC GATES

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to logic gates, and more particularly to the construction of various types of mechanical logic gates that require no electrical sensing elements or electrical power to provide logic signals in response to one or more input signals.

BACKGROUND

This section provides background information related to the present disclosure which is not necessarily prior art.

Early examples of computers were almost exclusively based on mechanical devices. Although electronic computers became dominant in the past 60 years, recent advancements in 3D micro-additive manufacturing technology provide new fabrication techniques for complex microstructures which have rekindled research interest in systems and methods able to carry out mechanical computations in response to various inputs.

Further to the above, in order to overcome the limitations of semiconductor electronics such as unstable performances and failures in extreme environments, researchers have been seeking for other computation approaches and logic computation devices on micro and submicro-scale, such as MEMS (micro-electro-mechanical system) logic gates and switches, all-optical logic gates, microfluidic logic devices based on droplets and bubbles, magnetic bubble logic, etc. Logic devices on an even smaller scale have also been proposed and studied, such as molecular logic gates and quantum logic gates. A major advantage of micro-mechanical logic devices is that they utilize energy in mechanical form and require no electrical power source or electronic components. As a result, such devices generate no electromagnetic signature and are highly insensitive to radiation damage. Furthermore, studies on computation reversibility have suggested that mechanical logic systems can theoretically be designed such that the energy dissipation in the system can be arbitrarily small, i.e., the computations consume nearly zero energy.

Several groups of researchers have started to explore the feasibility of mechanical computing systems. Merkle et al., arXiv Prepr, 2018 proposed a Turing-complete mechanical computing system Cooper, S. Barry, *Computability Theory*, Chapman and Hall/CRC, 2017, based on rigid links and rotary joints. The mechanical computation operates under a clocked external excitation, and the signal is represented by the displacement of rigid links that is guided and constrained by two basic mechanisms named locks and balances. Ion et al., In *Proc.* 2017 *CHI Conf. Hum. Factors Comput. Syst.—CHI '17*, ACM Press, New York, N.Y., USA, 2017, pp. 977-988, designed a functional-complete Enderton, Herbert and Herbert Enderton, *A Mathematical Introduction to Logic*, Elsevier, 2001, mechanical logic system that is integrated with 3D-printed metamaterial mechanisms. The digital signal propagates as mechanical impulses between adjacent cells through the embedded bi-stable springs. The bistable spring strengthens the incoming signal in a similar manner to the domino effect and requires a manual reset after each calculation. Raney et al., *Proc. Natl. Acad. Sci.* 2016, 113, 9722, proposed a structure that propagates mechanical signals over arbitrary distances without distortion. Logic operators such as the AND gate, the OR gate and the diode logic were demonstrated.

From the above, it will be appreciated that a strong growing interests exists in mechanical logic systems and methods which require no electronic sensing components, as well as no electrical power for their operation.

SUMMARY

This section provides a general summary of the disclosure, and is not a comprehensive disclosure of its full scope or all of its features.

In one aspect the present disclosure relates to a mechanical logic NOT gate system. The NOT gate system may comprise a first pair of bi-stable buckling structures each being operatively connected at a first connection point thereof to one another and also to a first rigid structure at second connection points, the first rigid structure being held stationary. A second pair of a second pair of bi-stable buckling structures may be included, with each being operatively connected at first connection points thereof to each other and at second connection points thereof to a second rigid structure being held stationary. An output element is included which is coupled to a first one of each of the first and second pairs of bi-stable buckling structures. An input element is included which is coupled to a second one of each of the first and second pairs of bi-stable buckling structures. The output element moves from a logic 1 position to a logic 0 position in response to movement of the input element from a logic 0 position to a logic 1 position, respectively.

In another aspect the present disclosure relates to a mechanical logic OR gate system. The system may comprise a first fixed structure, a second fixed structure spaced apart from the first fixed structure, and a central body acting as an output element, which is positioned between the first and second fixed structures. A first input element is also included which is supported by at least one first bi-stable flexure beam between a portion of the central body and the first fixed structure. A second input element is included which is supported by at least one second bi-stable flexure beam between the central body and the second fixed structure. At least one third bi-stable flexure beam is also incorporated which connects the first input element to the central body. At least one fourth bi-stable flexure beam is included which connects the second input element to the central body. An input applied to either one of the first or second input elements to cause movement from a logic 0 level position to a logic 1 level position of either one of the input elements, causes movement of the central body from a logic 0 level position to a logic 1 level position.

In still another aspect the present disclosure relates to a mechanical logic NAND gate system. The system may comprise a mechanical OR gate subsystem having first and second input elements and an output element. The system may also include a mechanical NOT gate having first and second mechanical NOT gates, each of the first and second mechanical NOT gates including a plurality of bi-stable buckling structures supported from a plurality of stationary structures. The first mechanical NOT gate includes an input element and an output element, the output element of the first mechanical NOT gate being coupled to the first input element of the OR gate subsystem. The second mechanical NOT gate includes an input element and an output element, with the output element of the second mechanical NOT gate being coupled to the second input element of the OR gate subsystem. When a logic 1 level signal is applied to one or the other of the input elements of the first or second mechanical NOT gates, this causes movement of the output element of the mechanical OR gate from a logic 0 level position to a logic 1 level position. Movement of both of the input elements of the first and second mechanical NOT gates to the logic 1 level position causes movement of the output element of the OR gate subsystem to the logic 0 level position.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which:

FIGS. 1b1 and 1b2 illustrate the two stable positions of the bi-stable flexure of FIG. 1a in response to different input signals;

FIG. 1d1-1f2 illustrate an un-deformed shape, FIG. 1d1 and 1d2 illustrate a first buckling mode shape, FIGS. 1e1 and 1e2 and second (FIGS. 1f1 and 1f2) buckling mode shapes and their corresponding critical compression distance $h_1$ and $h_2$ of two different bi-stable flexure mechanism designs;

FIGS. 2c1 and 2c2 illustrate geometry configurations of one embodiment of a NOT gate at the two stable states representing the negation of logic 0 and logic 1, respectively;

FIGS. 2d1-2d3 illustrate geometry configurations geometry configurations of one embodiment of an OR gate at Mode I (logic 0 or 1), Mode II and III (logic 0 OR 1 and logic 1 OR 0), and Mode IV (logic 1 OR 1);

DETAILED DESCRIPTION

Example embodiments will now be described more fully with reference to the accompanying drawings.

The present disclosure relates broadly to mechanical logic gates, including NOT, AND, OR, NAND, and NOR, which use transverse displacement of buckled microstructures to represent logic states. These mechanical logic gates enable digital computations to be made which are based purely on mechanical forces and displacements without the need for any electronic sensing components, and without requiring electrical power for operation of the herein-described logic gates. A key benefit of this mechanical computation approach is that such systems can be fabricated simultaneously as embedded parts of micro-architectured metamaterials. This offers an approach for designing new "smart" materials that are capable of interacting mechanically with a surrounding environment while processing and storing such information as digital data inside, without the need for electric power.

The operations of the logic gates are designed in 2D (two dimensions) based on bi-stable systems resulted from the buckling of micro-flexures. The chief difference between the existing mechanical logic gates and the designs proposed in this paper is that the proposed designs achieve the following properties simultaneously:

(1) Functional completeness: All possible digital logic operations can be expressed by combining the designed logic gates. The functional complete sets of binary logic gates are {AND, NOT}, {OR, NOT}, {NAND} and {NOR}, which will all be described in detail in the following paragraphs.

(2) Continuous operation: The logic gates described herein do not need to be reset to their initial state prior to the next logic operation. The presence of the input(s) will immediately trigger the operation.

(3) Scale independence: The logic gates described herein do not rely on any scale-dependent effects and can be easily scaled down to micro-scale. The operation of the logic gates described herein requires no sliding contact between physically contacting surfaces, to eliminate the risk of avoid failure caused by friction and wear on a micro-scale.

(4) Same level of stored energy in different logic states: The total stored deformation energy is identical in different logic states for the same logic gate. This allows for nearly zero-energy operation in theory.

Figure 1A:
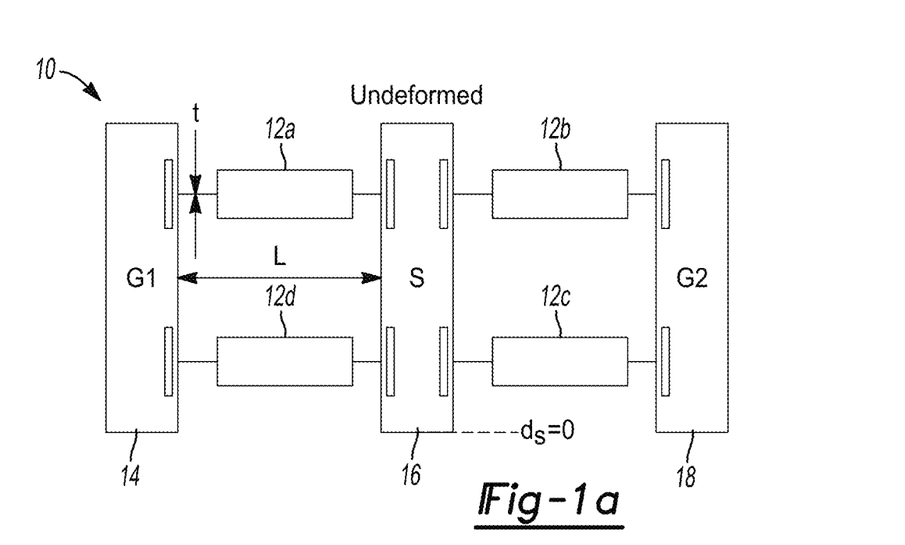
FIG. 1a is a high level diagram of a bi-stable flexure mechanism which may be used as a building block in the construction of various types of logic gates.

The mechanical logic gates presented in the present disclosure are based on bi-stable flexure mechanisms. One buckled flexure element and how it represents logic states can be seen in FIGS. 1a-1d. The un-deformed shape of one such buckled flexure system 10 is shown in FIG. 1a. The system 10 in this example makes use of four bi-stable flexure beams 12a-12d. Bi-stable flexure beams 12a and 12d may be constructed from a wide variety of materials, put at the present time plastic and rubber are especially suitable. In particular, acrylonitrile butadiene styrene plastic is especially convenient and effective in forming the bi-stable flexure beams 12a-12d.

Figure 1B:
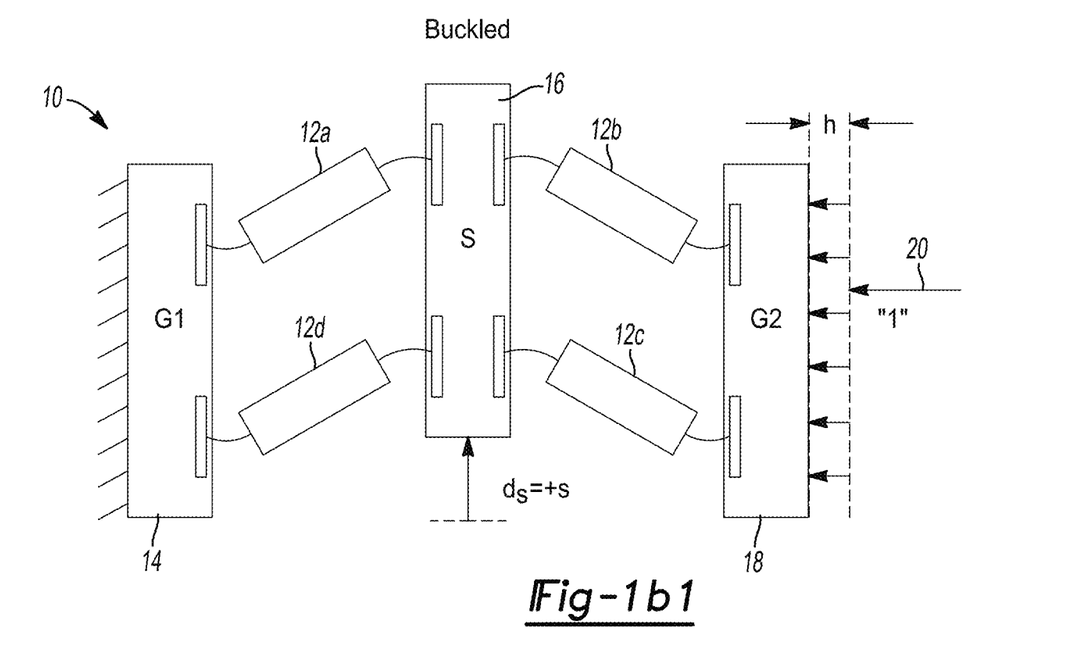
Figure 1B:
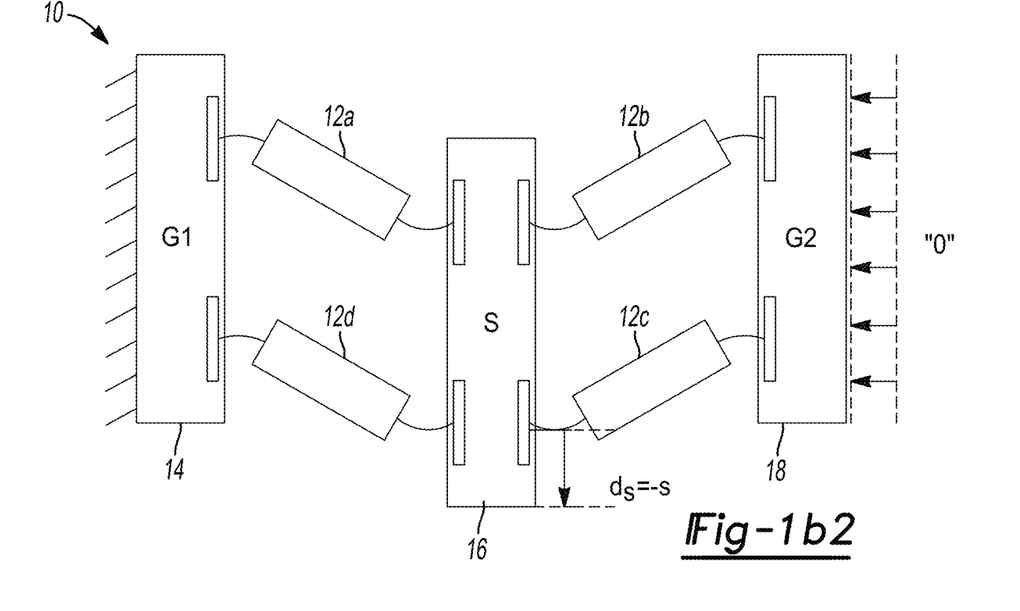

The bi-stable flexure beams 12a-12d are coupled at one end to a fixed structure 14 and at their opposite ends to a rigid body 16. Bi-stable flexure beams 12b and 12c are each coupled at one end to the rigid body 16, on a side of the rigid body 16 opposite to the connections of the bi-stable flexure beams 12a and 12d, as well as to a movable element 18. As shown in FIGS. 1b1 and 1b2, when the system 10 is compressed horizontally by a fixed distance "h" in response to a force applied along arrow 20, wherein the force along arrow 20 exceeds a critical buckling threshold of the bi-stable flexure beams 12a-12d, the rigid body 16 will no longer be stable at the original equilibrium position dS=0, but will instead rest at either one of the two stable positions, dS=−s (shown in FIG. 1c) and dS=+s3, both of which are shown in FIGS. 1b1 and 1b2. As shown in FIG. 1b1, the +s position in this example represents a logic 1 and the −s position represents a logic 0. By virtue of symmetry, the two stable states occupy the same energy with an energy barrier in between that must be overcome to transition between the states. This extra energy required for transition is released from the system after the transition completes, and thus can be used to trigger the transition of the next bi-stable flexure logic regardless of whether the transition is from a 0 state to a 1 state, or from a 1 state to a 0 state. This is particularly advantageous to a large mechanical computation system because it allows for mechanical digital signals to propagate in a wavelike manner with minimum attenuation from one logic gate/subsystem to the next.

Figure 1C:
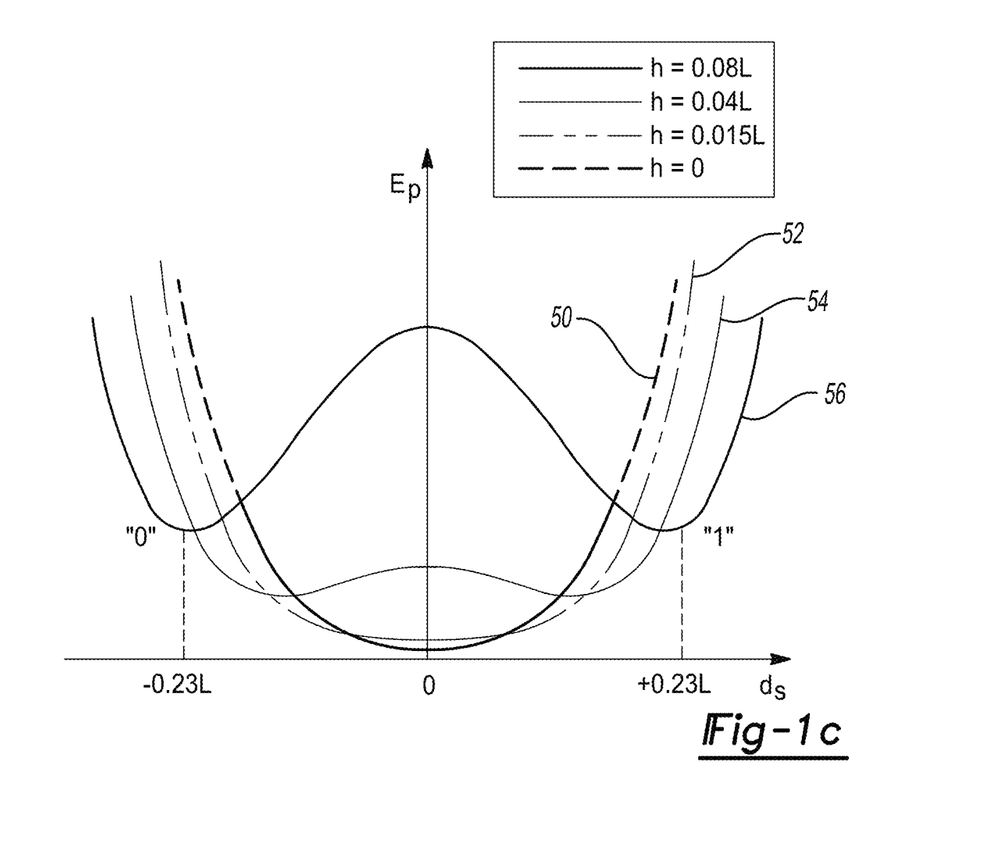
FIG. 1c illustrates curves graphs showing a total deformation energy $E_p$ as a function of the position $d_s$ and compression distance h.

FIG. 1c shows a plot of the FEA result of total potential energy Ep stored in the deformed flexure beams 12a-12d as a function of the position dS and the compression distance h. Curve 52 corresponds to h=0.08 L; curve 54 corresponds to h=0.015 L; curve 54 corresponds to h=0.04 L and curve 56 corresponds to h=0.08 L. The magnitude of the energy barrier can be tuned by adjusting the compression distance h, which is an additional design parameter apart from geometric dimensions. When the value of h increases beyond the second critical buckling threshold (h=0.163 L), secondary bifurcations occur in the post-buckling system, resulting in issues such as multi-mode buckling and mode jumping as the system 10 switches between the two logic states, as shown in a comparison between FIGS. 1e1 and 1e2 (where h1=0.015 L) and FIGS. 1f1 and 1f2 (where h2=0.163 L). FIGS. 1d1 and 1d2 show the flexure beam 12a in its unflexed condition.

Figure 1D:
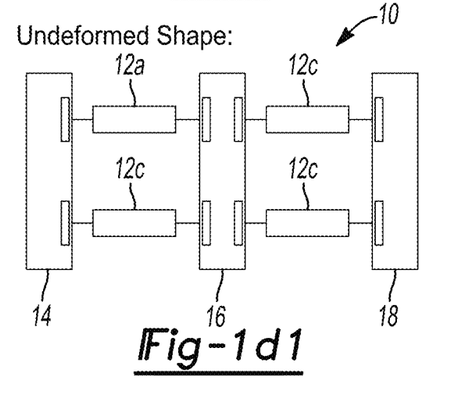
Figure 1D:
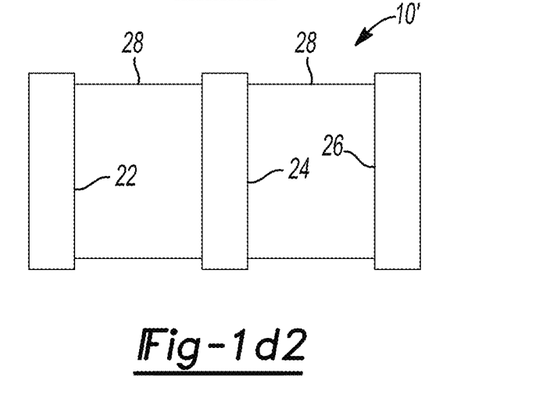
Figure 1E:
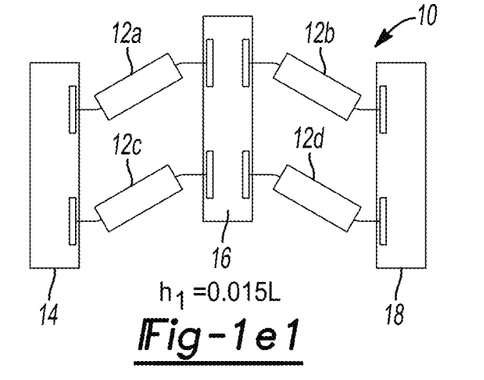
Figure 1E:
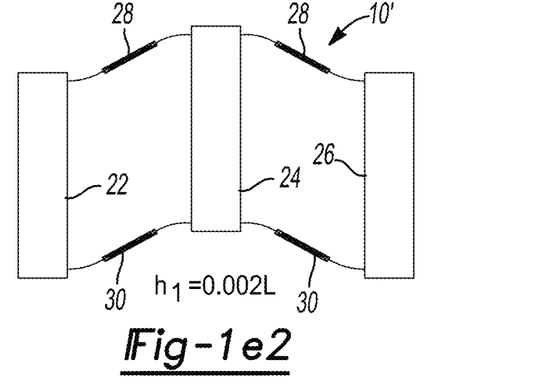
Figure 1F:
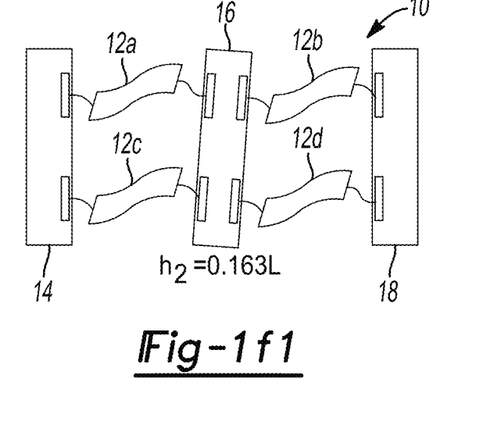
Figure 1F:
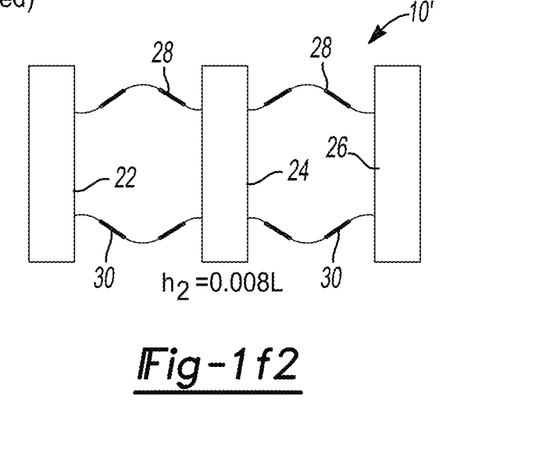

The design topology shown in FIG. 1a may be preferred among several alternatives for its enhanced buckling mode stability. The buckling mode analysis results of the proposed design of the system 10 of FIG. 1a is compared against an alternative Design B in FIG. 1d, where the rigid bodies 22,24 and 26 of the system 10' in FIG. 1d are simply connected by a pair of parallel beam flexure beams 28 and 30s. The FEA results suggest that the system 10 shown in FIG. 1a has a more stable first buckling mode and thus constructs an even more robust bi-stable system. In addition, the system 10 generates a larger distance between the two stable positions dS=±s, which results in a stronger binary signal.

Figure 2A:
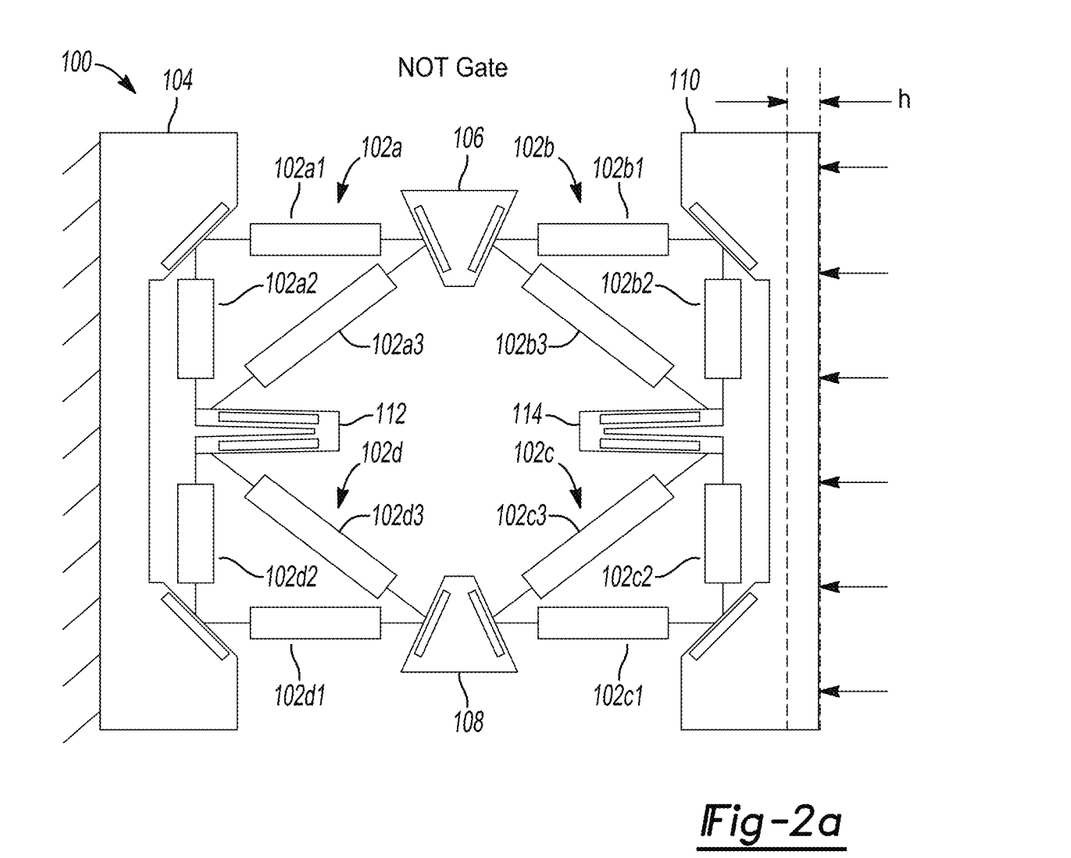
FIG. 2a shows one example of an un-deformed NOT gate in accordance with the present disclosure.
Figure 2B:
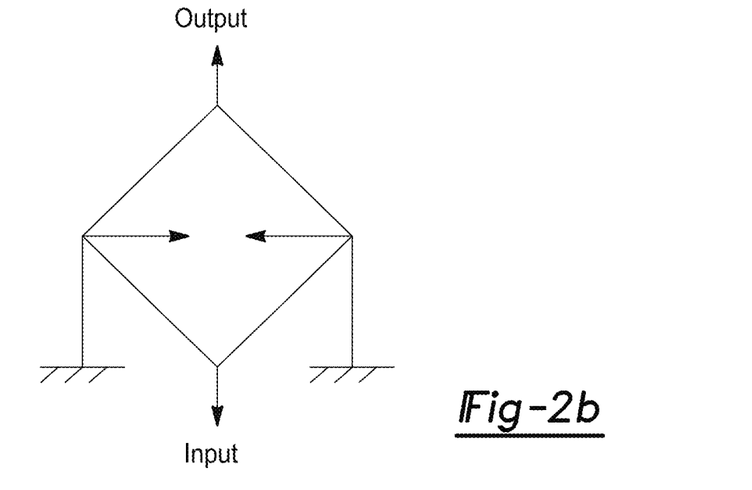
FIG. 2b illustrates a diagram explaining a mechanical inverter using bi-stable flexible beams.

By utilizing the bi-stable flexure beams such as beams 12a-12d as a building block, various useful logic gate mechanisms can be constructed. With such logic gate mechanisms, rigid bodies are linked through bi-stable flexure beams or similar flexure structures, and the resulting relationships between their motions are used to represent the basic digital logic operations. For example, one embodiment of a mechanical NOT gate system 100 is shown in FIG. 2a. The NOT gate system 100 has a working principle which is somewhat similar to the system 10, but instead of flexible beam-like bi-stable flexures 12a-12d, the NOT gate system 100 uses interconnected bi-stable buckling structures 102a-102d, wherein each bi-stable buckling structure is made of three flexure beam segments. In this example the three flexure beam segments are unequal in length and form a right triangle. Thus, bi-stable buckling structure 102a includes flexure beam segments 102a1-102a3; bi-stable buckling structure 102b includes flexure beam segments 102ba-102b3; bi-stable buckling structure 102c includes flexure beam segments 102ca-102c3 and bi-stable buckling structure 102d includes flexure beam segments 102d1-102d3. In this embodiment the bi-stable buckling structures 102a and 102d are each coupled at one corner to a fixed rigid structure 104. One corner of bi-stable buckling structure 102a is coupled to an output element 106 to provide the negation of the input signal. One corner of bi-stable buckling structure 102d is coupled to an input element 108. One corner of the bi-stable buckling structure 102b is also coupled to the output element 106 on a side opposite to that of the bi-stable buckling structure 102a, while the bi-stable buckling structure 102c is coupled to one side of the input element 106 opposite to that of the bi-stable buckling structure 102d. One corner of the bi-stable buckling structure 102b is coupled to a moveable rigid structure 110 and one corner of the bi-stable buckling structure 102c is also coupled to the moveable structure 110. Adjacent corners of bi-stable buckling structures 102a and 102d are coupled via U-shaped connecting structures 112, while corners of bi-stable buckling structures 102b and 102c are coupled by U-shaped connecting structure 114. This configuration places the output element 106 and the input element 108 longitudinally in line with one another with each of the elements 106 and 108 spaced evenly between the rigid structures 104 and 110.

Figure 2C:
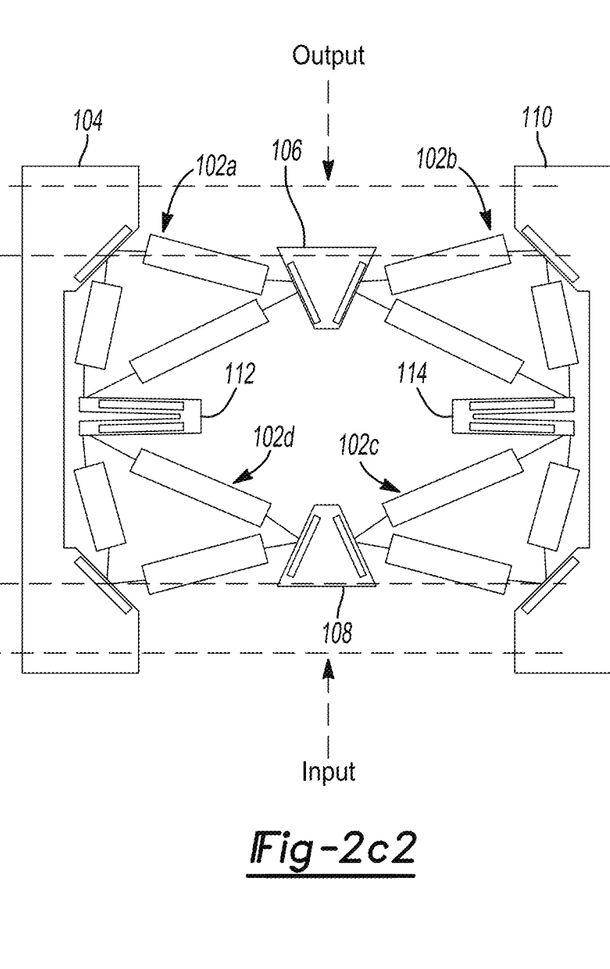
Figure 2C:
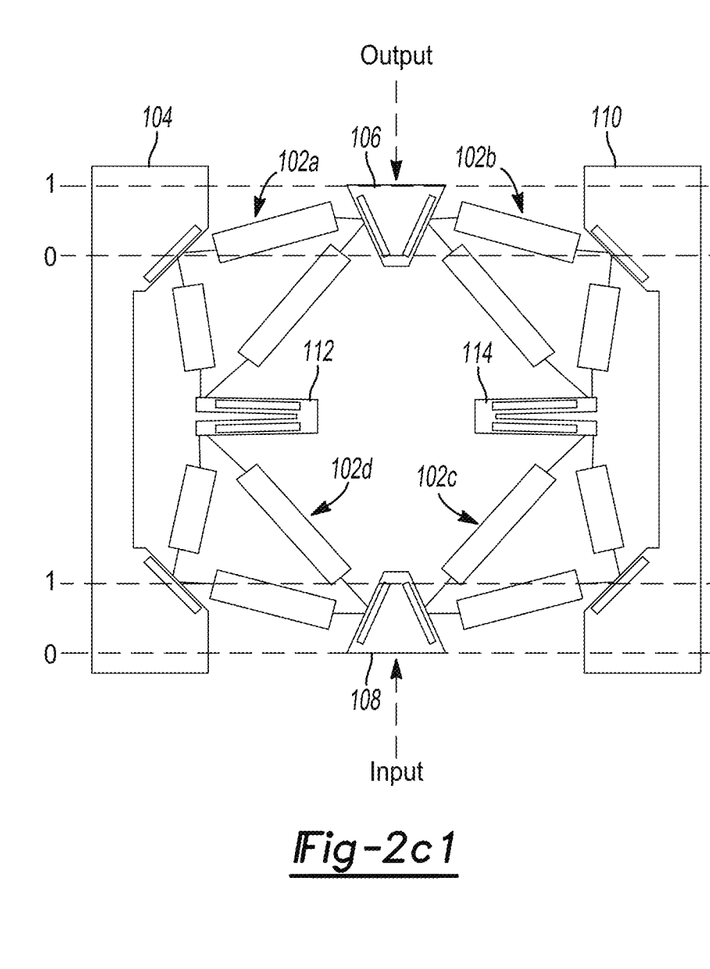

Positioning the moveable rigid structure 110 to a fixed buckling compression distance h imposes a compressive force on the bi-stable buckling structures 102a-102d, as shown in FIG. 2a. The NOT gate system 100 will then have two stable configurations as shown in FIGS. 2c1 and 2c2, representing the negation of the inputs 0 and 1, respectively. In FIG. 2c1, when the input element 108 is at the horizontal position defined by the dashed horizontal line labelled 0, the output element 106 will be at the horizontal line defined by a dashed line 1, and thus will be providing a 1 output (FIG. 2c1). When the input element 108 is at the horizontal position defined by dashed line 1, then the output element 106 will be at the horizontal position defined by the horizontal dashed line representing 0, and thus be at a 0 output. Unlike many other mechanical NOT gate designs that use rotational joints to reverse the direction of a mechanical displacement or force, the NOT gate system 100 uses no rotary connectors, thus is easier to manufacture additively and does not suffer from issues like energy loss and device failure due to friction and wear.

Figure 2D:
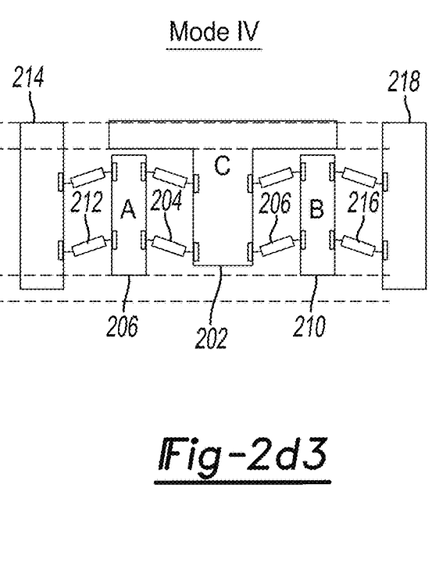
Figure 2D:
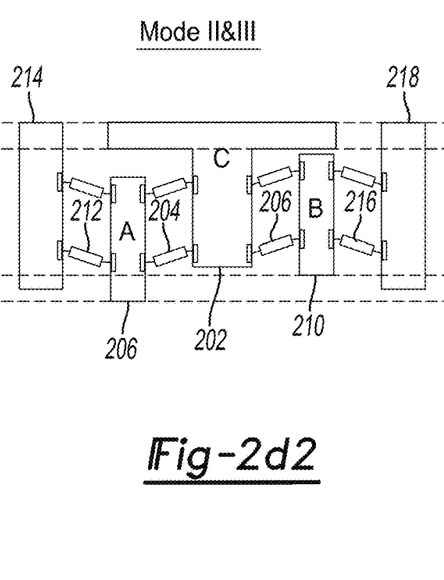
Figure 2D:
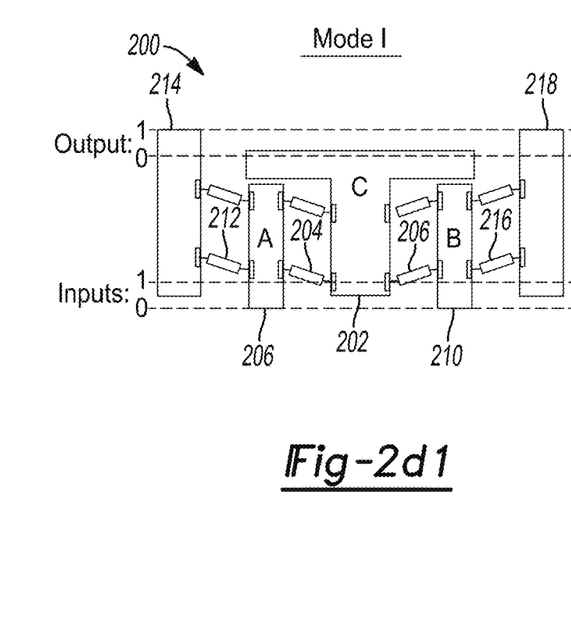

A mechanical OR gate system 200 is constructed by joining two sets of bi-stable flexure mechanism together as shown in FIG. 2d1. A central rigid body 202 representing an output element, which is movable in space, is supported by bi-stable flexure beams 204, which are in turn coupled to a rigid first input element 206, as well as a plurality of bi-stable flexure beams 208, which are in turn coupled to a rigid second input element 210. First input element 206 is supported by another plurality of bi-stable flexure beams 212 from a fixed structure 214, while the second input element 210 is supported via an additional plurality of bi-stable flexure beams 216, which are in turn secured at opposite ends to another fixed structure 218.

The vertical positions of the two rigid input elements 206 and 210 are controlled externally, representing the two inputs of the OR gate system 200, whereas the vertical position of the central rigid body 202 represents the output. Similar to the previously described compression process, the OR gate system 200 is compressed horizontally by a total distance of 2 h under a set of initial small perturbational forces that result in the deformed shape of Mode I in FIG. 2d1, where the two inputs are at logic states 0 and 0, and the output is 0. When the two rigid input elements 206 and 210 switch from a logic state 0 to a logic state 1, the central rigid body 202 moves accordingly to a logic 1 position, which creates the logic OR operation as shown in FIGS. 2d2 and 2d3.

Figure 3A:
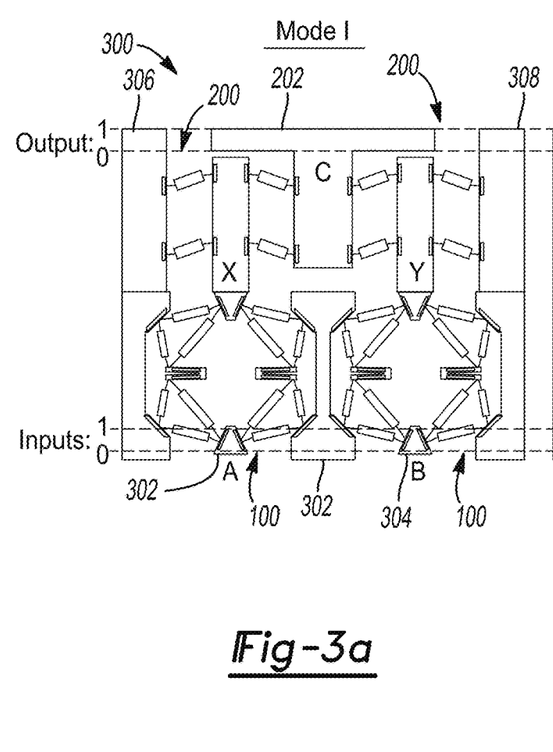
FIGS. 3a-3c illustrate geometry configurations of one embodiment of a NAND gate at Mode I, Mode II & III, and Mode IV.
Figure 3B:
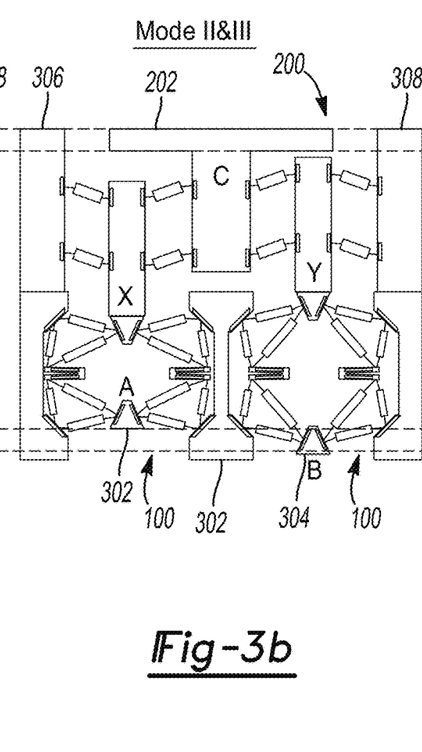
Figure 3C:
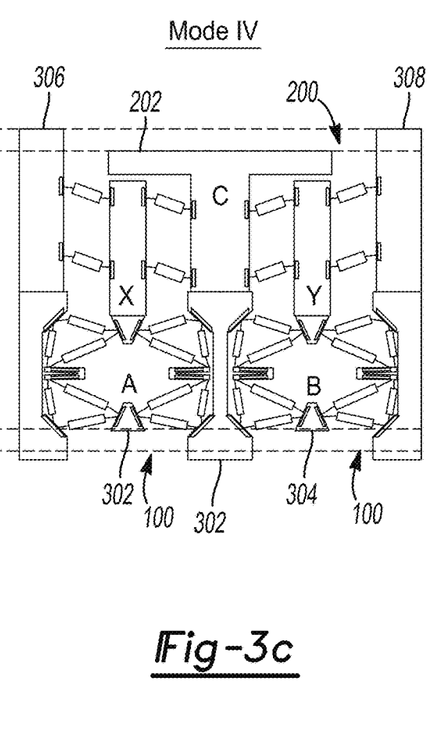

Referring to FIG. 3a, one embodiment of a functional-complete NAND gate system 300 is shown which is constructed using the aforementioned OR gate system 200 along with a pair of the above-described NOT gate systems 100. The input signals at input elements 302 and 304 are inverted by the two the NOT gate subsystems 100, which in this example are formed in a side-by-side configuration. The NOT gate subsystems 100 in this configuration pass the negation signals to the OR gate system 200 through the moveable input elements 206 and 210 of the OR gate system 200. This results in a final output at moveable output element 202 of the OR gate subsystem 200. FIGS. 3a-3c illustrate the positions of the various individual elements of the NAND gate system 300 at different logic states. The quasi-static timing diagram of the input(s) 302 and/or 304, and the output of the NOT, OR, and NAND gate are obtained using COMSOL Multiphysics software and shown in FIG. 4.

It will also be appreciated that a NOR gate can be constructed similarly using an AND gate with NOT gates on the inputs, or an OR gate with a NOT gate on the output. Accordingly, it will be appreciated that the gates described herein may be used as "building blocks" in constructing a wide variety of other logic circuits.

The FEA result suggests that the proposed logic gates can perform continuous logic operations without resetting to an initial configuration. Similar to the design of OR and NAND, AND and NOR gate systems can be constructed using the same bi-stable flexure mechanisms as described herein.

Figures 4, 5:
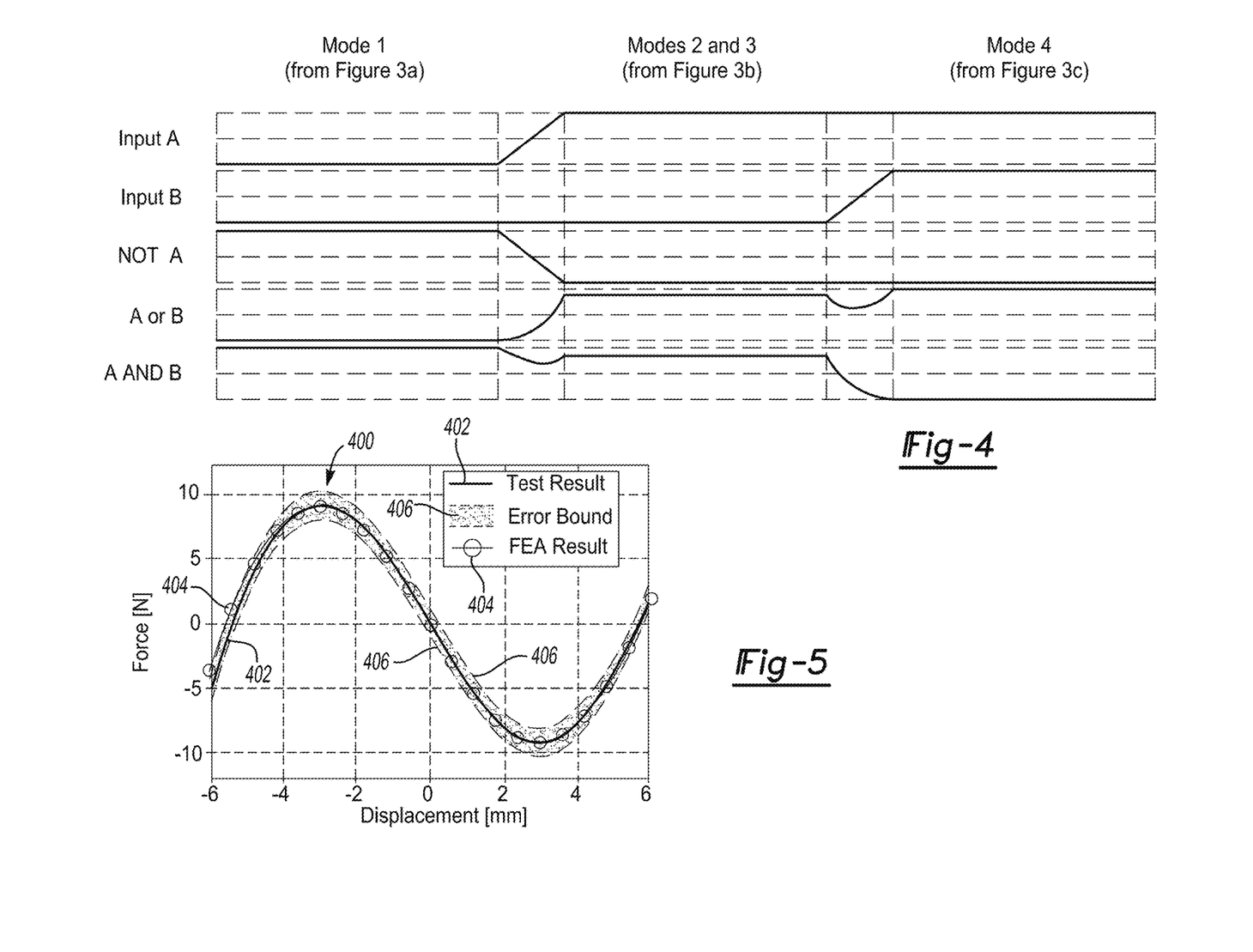
FIG. 4 illustrates a quasi-static timing diagram of the outputs of the NOT gate, the OR gate and the NAND gate when the inputs (A,B) transition from (0,0), to (1,0) and to (1,1)
FIG. 5 illustrates a graph of experimental test results illustrating the total force on a pair of rigid structures of a NAND gate, such as the NAND gate shown in FIG. 3a-3c, against their vertical displacement when the NAND gate system transitioned from Mode I (0 NAND 0) to Mode IV (1 NAND 1), which experimental test results are also in agreement with finite element analysis (FEA) results obtained using COMSOL Multiphysics simulation software, to within the error of the measurement.

The co-inventors have constructed a macroscale NAND gate, such as that shown in FIG. 3a, in a 3D-printing operation using ABS plastic (with an elastic modulus of 2,230 Mpa). To deform the structure into the buckled shape, the two rigid structures bodies 306 and 308 shown in FIG. 3a were compressed inward with the rigid body 310 fixed to the ground. An Instron tester was then used to measure the force-displacement relationships of the NAND gate's input elements 302 and 304 when switching between different logic states. FIG. 5 shows a graph 400 that illustrates plots showing the total force on the rigid structures 306 and 308 against their vertical displacement when the NAND gate system 300 transitioned from Mode I (0 NAND 0) to Mode IV (1 NAND 1). The experimental results, represented by solid curve 402, are in agreement with the FEA results, represented by curve 404, obtained from COMSOL Multiphysics software to within the error of the measurement. The error measurement is defined by the band between dashed lines 406.

Figure 6:
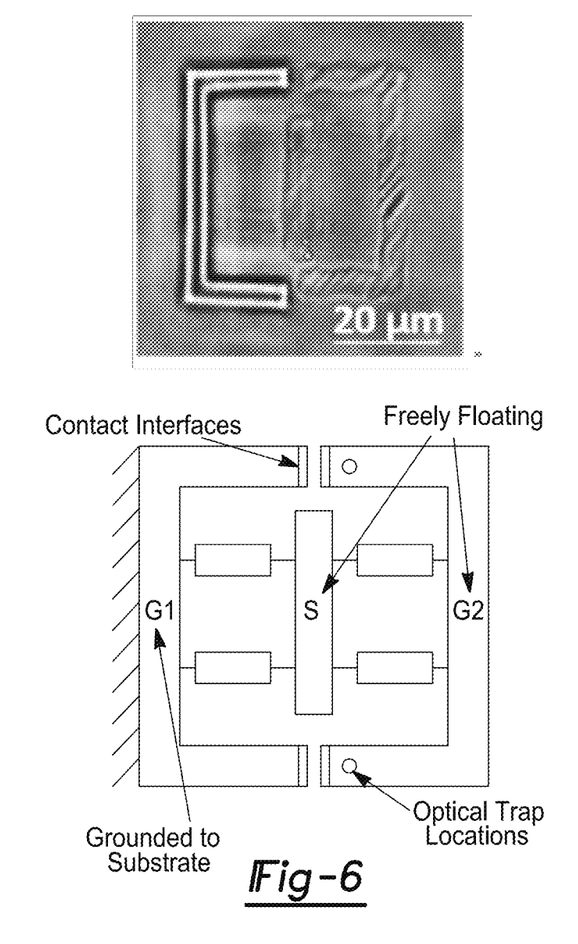
FIG. 6 illustrates a fabrication process for a bi-stable flexure mechanism that combines two-photon stereolithography (2PS) with holographic optical tweezers (HOT)
Figure 7:
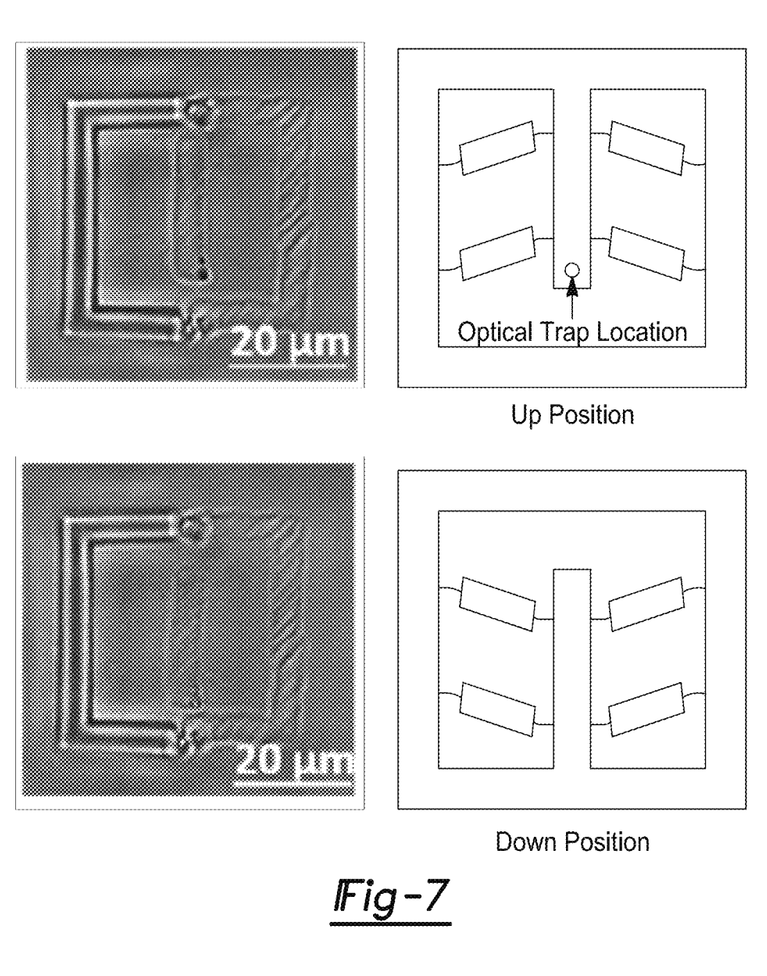
FIG. 7 illustrates a bi-stable flexure mechanism fabricated at microscale that can be driven between two stable positions.

A mesoscale NAND gate, like the NAND gate system 300, was also fabricated using projection microstereolithographic. In order to fabricate the proposed mechanical logic gates at micro-scale, a new approach is proposed that combines the utility of two-photon stereolithography (2PS) with holographic optical tweezers (HOT). In the fabrication process, the 2PS approach is used to print polymer structures with submicron resolution, and the HOT approach is used to exert optical forces to the structure to introduce stored energy into the flexures. The complete fabrication process was demonstrated for a bi-stable buckling flexure mechanism, and a brief summary is provided here. First, the CAD model of the bi-stable mechanism was converted into a point cloud which generated the scan path of a femtosecond pulsed laser in the liquid resin chamber. The un-deformed microstructure was thus polymerized by the laser at a resolution greater than 600 nm. The rigid bodies S and G2, as shown in FIG. 6, were free to move while the rigid body G1 was fixed to the substrate. Next, two optical traps are created at the ends of the rigid body G2 which pulls G1 and G2 into contact with each other. This movement causes the flexures to buckle and deform into one of the stable positions. With the two ends of the rigid bars in contact, they are fused together at the interfaces by locally curing the photopolymer via the 2PS approach, which completes the fabrication process. In order to imitate a digital logic signal, the center bar S is driven by an optical trap which switches the bistable mechanism between the up position and the down position (FIGS. 7a and 7b, respectively).

In summary, this present disclosure proposes a digital mechanical computation approach using additively manufacturable micro-mechanical logic gates. Functional logic gates such as AND, OR, NOT, NAND, NOR, as well as other logic gates, are constructed based on buckling bi-stability and may be verified using both finite element analysis and experiments. A viable micro-additive manufacture technique has been described for constructing such logic gates.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure;

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A mechanical logic NOT gate system comprising:
 a first pair of bi-stable buckling structures each being operatively connected at a first connection point thereof to one another and also to a first rigid structure at second connection points, the first rigid structure being held stationary;
 a second pair of bi-stable buckling structures each being operatively connected at first connection points thereof to each other and at second connection points thereof to a second rigid structure being held stationary;
 an output element coupled a first one of each of the first and second pairs of bi-stable buckling structures;
 an input element coupled to a second one of each of the first and second pairs of bi-stable buckling structures; and
 wherein the output element moves from a logic 1 position to a logic 0 position in response to movement of the input element from a logic 0 position to a logic 1 position, respectively.

2. The system of claim 1, wherein each one of the bi-stable buckling structures comprises a plurality of interconnected flexure beams.

3. The system of claim 2, wherein the flexure beams of each one of the bi-stable buckling structures are connected to form a triangle.

4. The system of claim 3, wherein the flexure beams of each one of the bi-stable buckling structures are connected to form a right triangle.

5. The system of claim 4, wherein portions of the first pair of bi-stable buckling structures are connected using a first U-shaped connection structure.

6. The system of claim 5, wherein portions of the second pair of bi-stable buckling structures are connected using a second U-shaped connection structure.

7. The system of claim 4, wherein each one of the bi-stable buckling structures includes three flexure beams connected to form a right triangle.

8. The system of claim 1, wherein the input element and the output element are connected so as to be longitudinally in line with one another and evenly spaced between the first and second rigid structures.

9. A mechanical logic OR gate system comprising:
 a first fixed structure;
 a second fixed structure spaced apart from the first fixed structure;
 a central body acting as an output element, which is positioned between the first and second fixed structures;
 a first input element supported by at least one first bi-stable flexure beam between a portion of the central body and the first fixed structure;
 a second input element supported by at least one second bi-stable flexure beam between the central body and the second fixed structure;
 at least one third bi-stable flexure beam connecting the first input element to the central body;
 at least one fourth bi-stable flexure beam connecting the second input element to the central body; and
 wherein an input applied to either one of the first or second input elements to cause movement from a logic 0 level position to a logic 1 level position of either one of the input elements, causes movement of the central body from a logic 0 level position to a logic 1 level position.

10. The system of claim 9, wherein the at least one first bi-stable flexure beam comprises a first pair of bi-stable flexure beams.

11. The system of claim 9, wherein the at least one second bi-stable flexure beam comprises a second pair of bi-stable flexure beams.

12. The system of claim 9, wherein the at least one third bi-stable flexure beam comprises a third pair of bi-stable flexure beams.

13. The system of claim 9, wherein the at least one fourth bi-stable flexure beam comprises a fourth pair of bi-stable flexure beams.

14. The system of claim 9, wherein inputs applied to both of the first and second input elements which cause both of the first and second input elements to move from a logic 0 level position to a logic 1 level position causes movement of the central body from a logic 0 level position to a logic 1 level position.

15. A mechanical logic NAND gate system comprising:
a mechanical OR gate subsystem having first and second input elements and an output element;
a mechanical NOT gate having first and second mechanical NOT gates, each of the first and second mechanical NOT gates including a plurality of bi-stable buckling structures supported from a plurality of stationary structures;
the first mechanical NOT gate including an input element and an output element, the output element of the first mechanical NOTgate coupled to the first input element of the OR gate subsystem;
the second mechanical NOT gate including an input element and an output element, the output element of the second mechanical NOT gate coupled to the second input element of the OR gate subsystem; and
wherein a logic 1 level signal applied to one or the other of the input elements of the first or second mechanical NOT gates causes movement of the output element of the mechanical OR gate from a logic 0 level position to a logic 1 level position, and movement of both of the input elements of the first and second mechanical NOT gates to the logic 1 level position causes movement of the output element of the OR gate subsystem to the logic 0 level position.

16. The system of claim 15, wherein each of the NAND gates includes four interconnected ones of the bi-stable buckling structures.

17. The system of claim 15, wherein each one of the bi-stable buckling structures includes a plurality of interconnected flexure beams.

18. The system of claim 17, wherein the interconnected flexure beams of each of the NOT gates are coupled to form a triangle.

19. The system of claim 18, wherein the interconnected flexure beams of each of the NOT gates form a right triangle, with one corner of each one of the right triangles coupled to either the input element of the OR gate subsystem or one of the input elements of one of the NOT gates, and one corner of each of the right triangles is coupled to one of the plurality of stationary structures such that the NOT gates are formed in a side-by-side configuration.

* * * * *